United States Patent
Bailey et al.

(10) Patent No.: US 9,112,428 B2
(45) Date of Patent: Aug. 18, 2015

(54) APPLICATION OF NORMALLY-ON SWITCHING ELEMENTS/DEVICES IN A STACKED SWITCHING CIRCUIT

(71) Applicant: Power Integrations, Inc., San Jose, CA (US)

(72) Inventors: Douglas John Bailey, Los Gatos, CA (US); David Michael Hugh Matthews, Los Gatos, CA (US)

(73) Assignee: Power Integrations, Inc., San Jose, CA (US)

( * ) Notice: Subject to any disclaimer, the term of this patent is extended or adjusted under 35 U.S.C. 154(b) by 252 days.

(21) Appl. No.: 13/646,531

(22) Filed: Oct. 5, 2012

(65) Prior Publication Data

US 2014/0097701 A1    Apr. 10, 2014

(51) Int. Cl.
| | |
|---|---|
| H02M 3/335 | (2006.01) |
| H02M 7/538 | (2007.01) |
| H03K 17/10 | (2006.01) |
| H03K 17/687 | (2006.01) |

(52) U.S. Cl.
CPC ............ *H02M 7/538* (2013.01); *H03K 17/102* (2013.01); *H03K 17/6871* (2013.01); *H03K 2017/6875* (2013.01); *H03K 2217/0045* (2013.01); *Y10T 307/747* (2015.04)

(58) Field of Classification Search
CPC .. H02M 7/538; H03K 17/102; H03K 17/6871
USPC .................. 363/17, 21.12, 98, 132
See application file for complete search history.

(56) References Cited

U.S. PATENT DOCUMENTS

| | | | | |
|---|---|---|---|---|
| 5,422,563 | A   * | 6/1995  | Pflueger ...................... | 323/312   |
| 6,466,465 | B1 * | 10/2002 | Marwali ..................... | 363/56.03 |
| 2003/0168919 | A1 * | 9/2003  | Friedrichs et al. ........... | 307/113   |
| 2004/0217801 | A1 * | 11/2004 | Scollo et al. ................ | 327/478   |
| 2009/0135636 | A1 * | 5/2009  | Kuzumaki et al. ........... | 363/132   |
| 2011/0291738 | A1 * | 12/2011 | Biela et al. .................. | 327/430   |

OTHER PUBLICATIONS

Semisouth, Application Notes AN-SS7, Apr. 2012, Semisouth, Rev 1.0, 1-20.*
Domes, D., et al., "Cascade Light—normally-on JFET stand alone performance in a normally-off Cascode circuit," Infineon Technologies AG, Max-Planck-Staβe 5, 59581 Warstein, Germany, PCIM Europe 2010 (5 pages).

* cited by examiner

*Primary Examiner* — Jue Zhang
(74) *Attorney, Agent, or Firm* — Blakely Sokoloff Taylor & Zafman LLP (57) ABSTRACT

A stacked switching circuit with normally-on devices includes a first normally-on switch coupled between a first input rail and an output port, and is coupled to be switched in response to a first control signal. A second normally-on switch is coupled to the output port and is coupled to a normally-off switch in a cascode coupled configuration. A second terminal of the normally-off switch is coupled to a second input rail. The normally-off switch is coupled to be switched in response to a second control signal. Switching of the stacked switching circuit is coupled to provide chopped high frequency pulses through the output port. Current flow through the stacked switching circuit between the first input rail and the second input rail is blocked at startup.

20 Claims, 5 Drawing Sheets

APPLICATION OF NORMALLY-ON SWITCHING ELEMENTS/DEVICES IN A STACKED SWITCHING CIRCUIT

BACKGROUND INFORMATION

1. Field of the Disclosure

The present invention relates generally to power supplies, and in particular but not exclusively, relates to switching devices for the switched mode power supplies.

2. Background

A wide variety of household or industrial appliances require a regulated direct current (dc) power source for their operation. Switch mode power supplies are to convert a low frequency (e.g. 50 Hz or 60 Hz) high voltage alternating current (ac) or a direct current (dc) input voltage to the required level of dc output voltage. Various types of switch mode power supplies are popular because of their well-regulated output, high efficiency, and small size along with the safety and protection features. Flyback converters, forward converters, various configurations of resonance converters are among the very popular example topologies that are utilized for switch mode power supplies.

One major component of a switch mode power supply is the high frequency (HF) switching device that chops the dc, rectified or low frequency ac input to HF pulses by utilizing a controller to turn on and off the switching device. Different control methods such as pulse width modulation (PWM), pulse frequency modulation (PFM), or on-off control, which disables some of the cycles of the switching waveform generated by the controller, are utilized to regulate the output voltage with respect to load and line variations.

The HF pulses at the output of the power supply are rectified and filtered to provide a regulated dc output, which may then be provided to the electronic device being powered. The HF pulses are transferred to the output through a HF transformer, which is typically small and utilized to change the input voltage level to an output voltage level as well as provide galvanic isolation between the input of the power supply and the electronic device being powered at output of the power supply. The switching device in different configurations may appear as a single switching device or a switching circuit module that includes a combination of multiple switching devices. The different configurations employed in the different topologies may include a single switching action or synchronized multiple switching actions in half-bridge or full-bridge switching configurations.

Output regulation in a switched mode power supply is usually provided by sensing the output of the power supply and controlling the power supply in a closed loop. The output sense and feedback or control signal can be provided with an opto-coupler from a sense circuit coupled to the output. In some other switched mode power supplies, the feedback or control signal could be extracted indirectly from an extra winding that is magnetically coupled to the output winding of the power supply on the same transformer core called a bias, auxiliary or feedback winding, which in some cases may also provide the supply for the controller.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale. Switch mode power supplies in accordance with the teachings of the present invention include a switching section, which may also be referred to as a switching circuit module, having one or more switching devices that are switched on and off at high frequencies by a single or a plurality controllers. It is appreciated that although examples of triplet switching configurations described herein for explanation purposes, other stacked switch configurations utilizing different numbers of stacked series switches may also be employed in accordance with the teachings of the present invention.

By chopping the input voltage into pulses, energy is transferred through a HF transformer of the power supply to the output. The transformer provides safety isolation while transforming the voltage level, usually to a lower desired voltage level. Voltage at the output of the power supply after being rectified and filtered is applied to a load such as for example an electronic appliance.

Figure 1A:
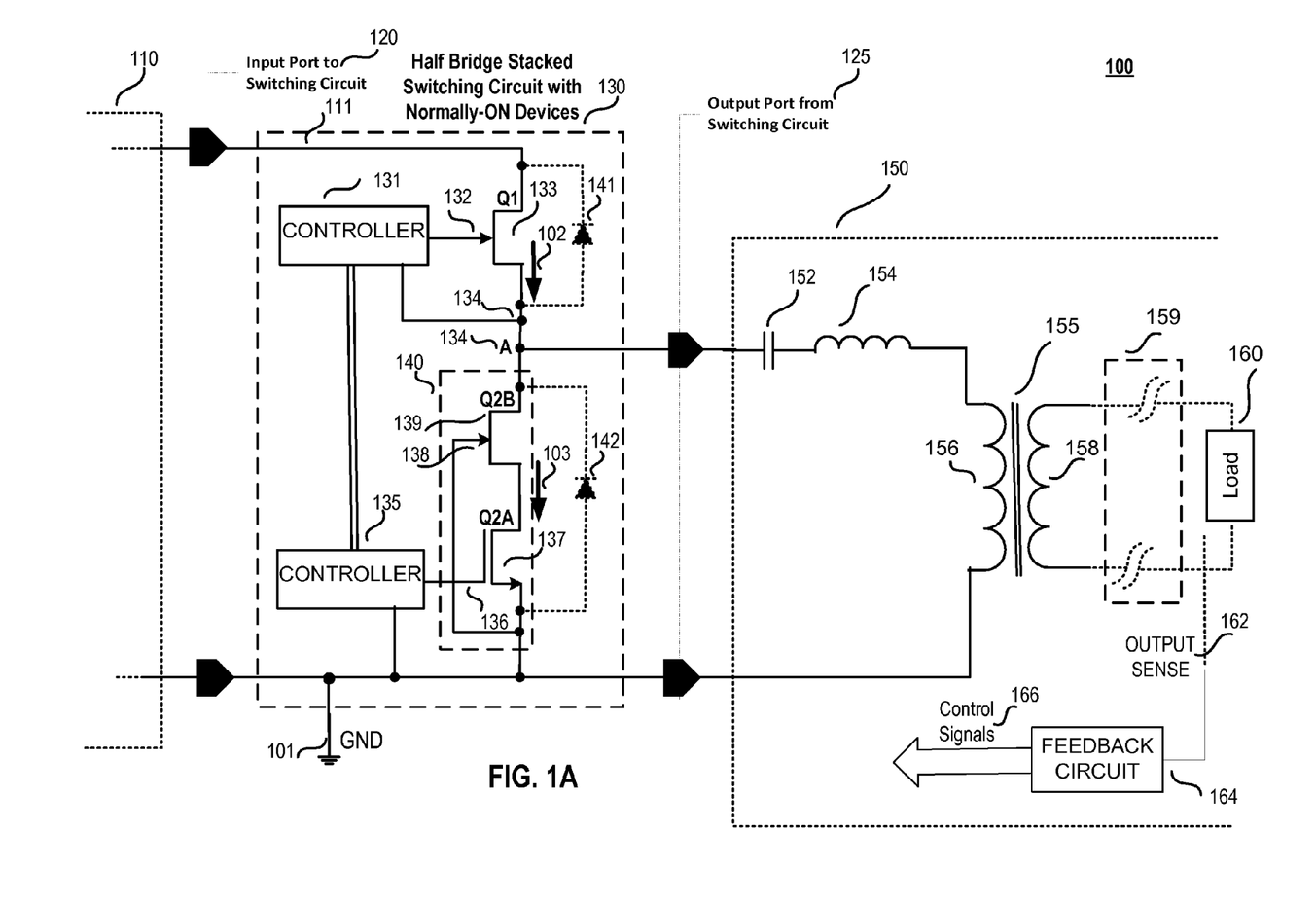
FIG. 1A is an example schematic illustrating generally one example of a half-bridge triplet switching circuit utilized in an example power supply in accordance with the teachings of the present invention.

To illustrate, FIG. 1A shows generally an example schematic of a converter 100 utilizing a stacked switching circuit with normally-on devices 130 in accordance with the teachings of the present invention. As shown in the depicted example, a front end stage 110 is coupled to an input port 120 of a stacked switching circuit with normally-on devices 130. In one example, front end stage 110 may include line protection circuitry, an electromagnetic interference (EMI) filter and an input rectifier, in the case of an ac-dc converter. As shown in the depicted example, stacked switching circuit with normally-on devices 130 includes an input port 120 having two rails that are coupled to receive dc or rectified ac from the two rails of the output port of front-end stage 110. As shown in the example of FIG. 1A, the two rails of the input port 120 include a primary high-voltage rail 111 and a primary ground rail 101, which in the example is coupled to ground. In one example, stacked switching circuit with normally-on devices 130 includes an output port 125 that is coupled to provide chopped pulses to an input port of stage 150.

In the example depicted in FIG. 1A, output port 125 includes a high potential terminal A 134 and primary ground rail 101. Stage 150 is an LC tank circuit including a series capacitor 152 and inductor 154 generating either sinusoidal resonance or linear current pulses. As shown, high potential terminal A 134 is coupled to capacitor 152 of the LC tank circuit of stage 150. The example LC tank circuit of stage 150 is an isolated converter that transfers the sinusoidal resonance or linear current pulses from capacitor 152 and inductor 154 through the transformer 155 from primary winding 156 to the secondary winding 158 with desired level change, which is followed by an output stage 159 as shown. In one example, output stage 159 includes an output rectifier and output filter, which are not shown in FIG. 1A, coupled to a load 160. In one example, the output of output stage 159 is sensed with output sense 162 through feedback circuit 164. Process circuitry generates control signals 166 coupled to be received by controller 131 and controller 135 to control switching of switching devices 133 and 140 with appropriate gating signals 132 and 136 to provide output regulation in accordance with the teachings of the present invention.

In the example depicted in FIG. 1A, stacked switching circuit with normally-on devices 130 is a half-bridge stacked switching circuit with normally-on devices that includes a normally-on switch 133 coupled in series with a normally-off switching device structure 140 between the primary high-voltage rail 111 and the primary ground rail 101. In the illustrated example, the normally-on switch 133 forms an upper switching unit of a half-bridge converter configuration and the normally-off switching device structure 140 forms a lower switching unit of the half-bridge converter configuration. As depicted in the illustrated example, normally-off switching device structure 140 is a single packaged cascoded compact semiconductor integrated circuit switching device that includes a normally-on switch 139 cascoded with normally-off switch 137. In one example, normally-on switch 133 and normally-on switch 139 may be a implemented from a wide selection of semiconductor normally on switches including high voltage normally-on SiC transistors or GaN device that are referred as HEMT (High Electron Mobility Transistors) or JFET switches, which will be referred to hereafter as normally-on switches. The normally-off switch 137 is a low voltage normally-off N-channel MOSFET. As shown, the node between normally-on switch 133 and normally-off switching device structure 140 is high potential terminal A 134, which is coupled to the LC tank circuit of stage 150 as mentioned above. Thus, normally-on switch 133 is coupled between the LC tank circuit of stage 150 and one of the rails of input port 120 and normally-off switching device structure 140 is coupled between the LC tank circuit of stage 150 and the other one of the rails of input 120 in accordance with the teachings of the present invention.

In one example, a first controller 131 is coupled to generate a gate signal 132, which is coupled to be received by a gate terminal of normally-on switch 133. Controller 131 is also coupled to the source terminal of normally-on switch 133 and high potential terminal A 134 as shown. In one example, a second controller 135 is coupled to generate a gate signal 136, which is coupled to be received by a gate terminal of normally-off switch 137 of normally-off switching device structure 140. Controller 135 is also coupled to controller 131, the source terminal of normally-off switch 137, and primary ground rail 101 as shown.

As shown in the example, the gate terminal 138 of the normally-on switch 139 is coupled such that it is off when the series normally-off switch is on. In the example, the gate of the normally-on switch 139 is tied to the source terminal of normally-off switch 137, which causes normally-on switch 139 to be turned off when the drain-source voltage across normally-off switch 137 results in a negative gate-source voltage $V_{GS}$ for switch 139 that pinches off the channel of normally-on switch 139. As a result, in one example, the combination of high voltage normally-on switch 139 and low voltage normally-off MOSFET switch 137 forms a normally-off switching device structure 140 that blocks current flow until gate signal 136 from controller 135 actively drives the gate of normally-off switch 137 to turn on normally-off switch 137. It is appreciated that in other examples the gate 138 of normally on switch 139 could be coupled to an output of controller 135 such that it is actively driven to turn on and off once the controller 135 is active. Such a configuration may have advantages such as being able to actively drive the gate 138 of normally on switch 139 high during the time normally off switch 137 is on to ensure that the normally on switch 139 is fully enhanced and introduces the minimum possible resistance in the current path 103.

Therefore, when power supply 100 is initially powered up, the combination of normally-on switch 139 and normally-off switch 137 in normally-off switching device structure 140 blocks any current flow between primary high-voltage rail 111 and primary ground rail 101 in accordance with the teachings of the present invention. It is noted that normally-on switch 133 is on when power supply 100 is first powered up because controller 131 is not powered and therefore cannot generate gate signal 132 to turn off normally-on switch 133. However, since normally-off switching device structure 140 is off at power up and since the LC tank circuit of stage 150 includes series capacitor 152, there is no current flow between primary high-voltage rail 111 and primary ground rail 101, and converter 100 is therefore safe at power up in accordance with the teachings of the present invention even if normally-on switch 173 is on when power supply 190 is first powered up. It is also appreciated therefore that safety is provided with stacked switching circuit with normally-on devices 130 without having to include a normally-off switch cascoded with normally-on switch 133, which therefore reduces costs and increases efficiency of stacked switching circuit with normally-on devices 130 in accordance with the teachings of the present invention.

Figure 1B:
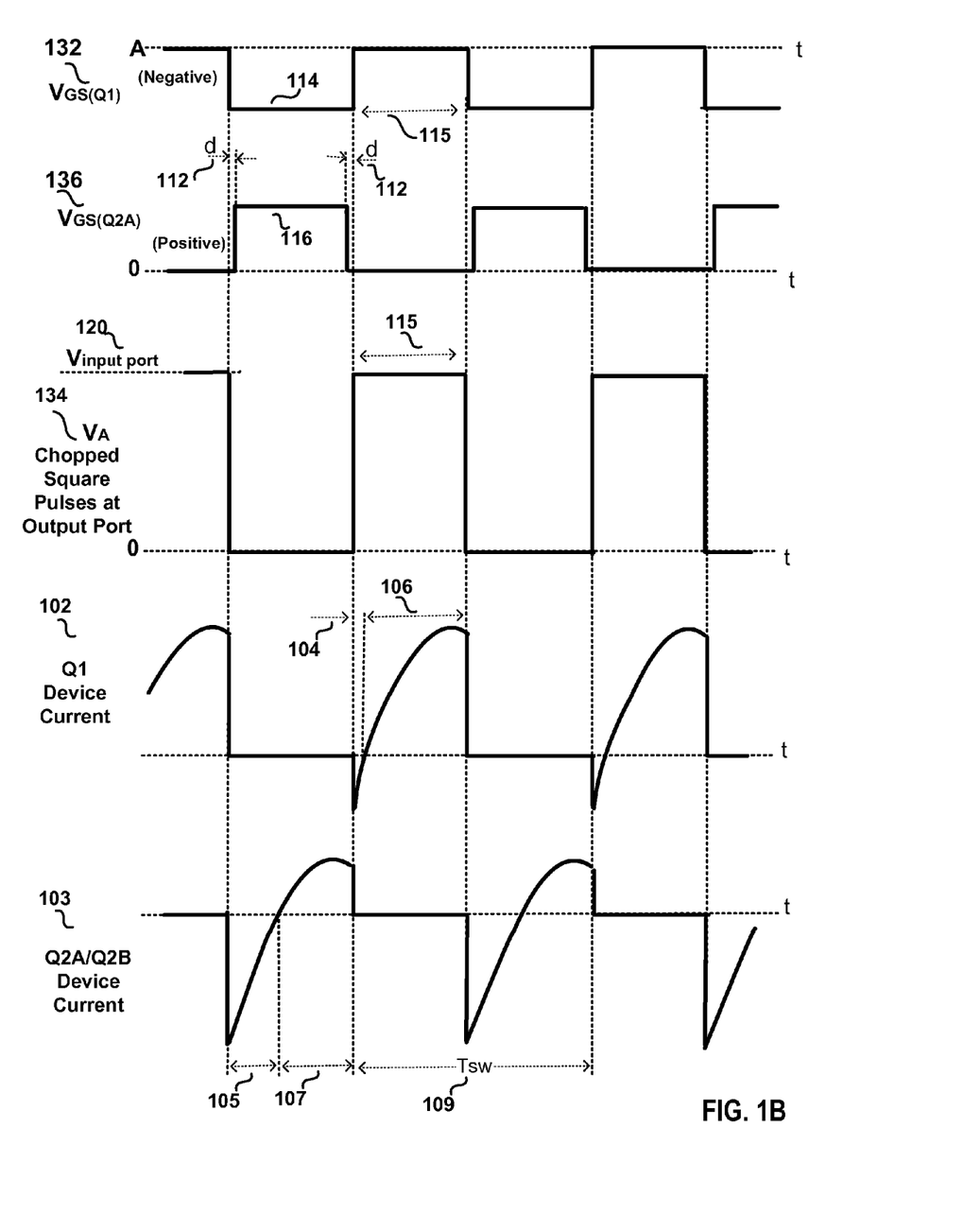
FIG. 1B illustrates example waveforms associated with the example half-bridge triplet switching circuit of FIG. 1A in accordance with the teachings of the present invention.

FIG. 1B illustrates example waveforms diagrams associated with the example half-bridge stacked switching circuit with normally-on devices of FIG. 1A in accordance with the teachings of the present invention. In FIG. 1B, the top waveform diagram shows an example of gate signal 132 for the normally-on switch 133, which in one example is an N-channel JFET that normally remains on and conducts current 102 until a negative gate-source voltage $V_{GS}$ 114 is applied to normally-on switch 133. The second waveform diagram in FIG. 1B depicts the gate signal 136 for the normally-off switching device structure 140, which includes normally-on switch 139 cascoded in series with normally-off switch 137. As mentioned above, in one example, normally-off switching device structure 140 includes the combination of high voltage normally-on switch 139 and low voltage normally-off MOSFET switch 137 that forms a normally-off switching device structure 140 that blocks current flow until gate signal 136 from controller 135 actively drives the gate of normally-off switch 137 to turn on normally-off switch 137 by applying a gate-source voltage $V_{GS}$ 116 to normally-off switch 137 that is above its turn on threshold voltage.

As shown in the example depicted in FIG. 1B, there is a marginal delay d 112 after gate signal 132 applies the negative gate-source voltage $V_{GS}$ 114 to the normally-on switch 133 before the gate signal 136 can apply the positive gate-source voltage $V_{GS}$ 116 to normally-off switch 137 to avoid any shoot-through normally-off switching device structure 140 as a consequence of an overlap of gate signal 132 and gate signal 136. In other words, normally-off switching device structure 140 is turned on with a marginal delay d 112 after the negative gate-source voltage 114 has been applied and normally-on switch 133 has been pinched OFF. As well, the negative gate-source voltage $V_{GS}$ 114 to the normally-on switch 133 is removed with the marginal delay d 112 after positive gate-source voltage $V_{GS}$ 116 is removed from gate terminal of normally-off switching device structure 140 to assure it has been completely turned off before normally-on switch 133 is turned back on. As a result the chopped square pulses 134 $V_A$ at output port 125 of the stacked switching circuit with normally-on devices 130 as depicted in the third waveform diagram of FIG. 1B changes between the voltage level of primary high-voltage rail 111 and a primary ground rail 101, with a pulse width that equals the intervals 115 as depicted in FIG. 1B.

The next two waveform diagrams in FIG. 1B illustrate example LC tank sinusoidal resonant current pulse waveforms 102 and 103 for a few switching cycles 109 in the upper and lower switching devices of the half-bridge stacked switching circuit with normally-on devices 130 in accordance with the teachings of the present invention. The upper switching device current waveform 102 is in the condition of the above resonance operation in which the resonance current lags behind the applied voltage, which in other words is the fundamental of the chopped square pulses that appear at high potential terminal A 134 at the output port 125 of stacked switching circuit with normally-on devices 130. As a characteristic of the above resonance with Zero Voltage Switching (ZVS), the current before transferring to the switch (upper or lower switch) flows in a reverse direction (e.g., through antiparallel diode of the normally-off MOSFET and through the reverse path of the normally-on switch or through any antiparallel diodes that could externally be applied to the switching devices). Thus, during interval 104, current 102 flows in reverse a direction of the normally-on switch 133 and then direction changes to the forward current path at interval 106. The lower switching device current waveform 103 at the switching second half-cycle would first in interval 105 flow in reverse direction of the cascoded switching device 140 and after changing direction in interval 107 flows in forward direction.

Figure 1C:
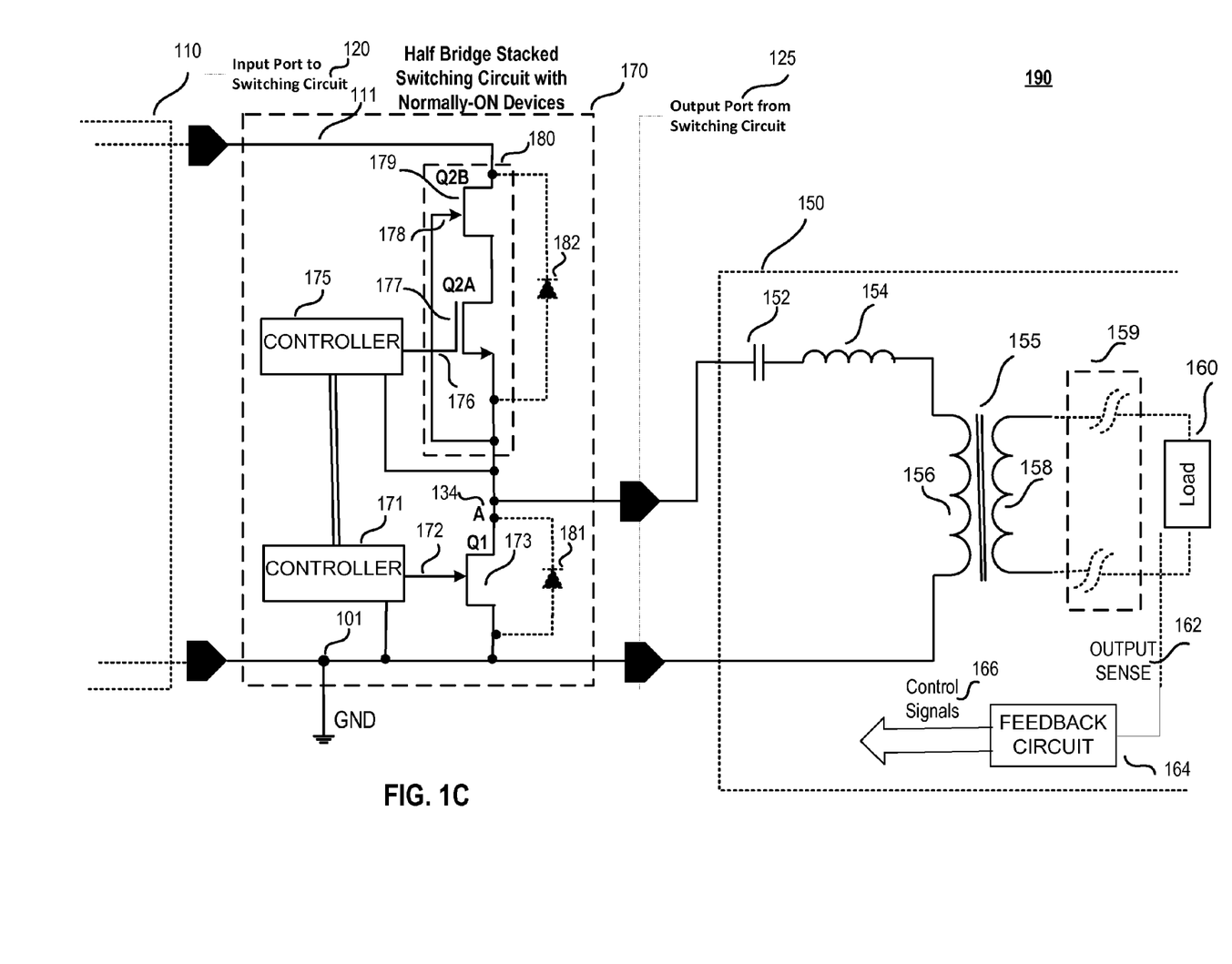
FIG. 1C is another example schematic illustrating generally another example of a half-bridge triplet switching circuit utilized in an example power supply in accordance with the teachings of the present invention.

FIG. 1C is another example schematic illustrating generally another example of a half-bridge stacked switching circuit with normally-on devices 170 utilized in an example power supply 190 in accordance with the teachings of the present invention. It is appreciated that half-bridge stacked switching circuit with normally-on devices 170 of FIG. 1C shares many similarities with the example half-bridge stacked switching circuit with normally-on devices 130 of FIG. 1A and that similarly numbered features between the drawings may be substituted for one another in the drawings. As shown in the example of FIG. 1C, a front end stage 110 is coupled to an input port 120 of stacked switching circuit with normally-on devices 170. As shown in the depicted example, stacked switching circuit with normally-on devices 170 also includes an input port 120 having two rails that are coupled to receive dc or rectified ac from the two rails of the output port of front-end stage 110. As shown in the example of FIG. 1A, the two rails of the input port 120 include a primary high-voltage rail 111 and a primary ground rail 101, which in the example is coupled to ground. In one example, stacked switching circuit with normally-on devices 170 also includes an output port 125 that is coupled to provide chopped pulses to an input port of stage 150.

In the example depicted in FIG. 1C, output port 125 includes a high potential terminal A 134 and primary ground rail 101. Stage 150 is an LC tank circuit including a series capacitor 152 and inductor 154 generating either sinusoidal resonance or linear current pulses. As shown, high potential terminal A 134 is coupled to capacitor 152 of the LC tank circuit of stage 150. The example LC tank circuit of stage 150 is an isolated converter that transfers the sinusoidal resonance or linear current pulses from capacitor 152 and inductor 154 through the transformer 155 from primary winding 156 to the secondary winding 158 with desired level change, which is followed by an output stage 159 as shown. In one example, output stage 159 includes an output rectifier and output filter, which are not shown in FIG. 1C, coupled to a load 160. In one example, the output of output stage 159 is sensed with output sense 162 through feedback circuit 164. Process circuitry generates control signals 166 coupled to be received by controller 171 and controller 175 to control switching of switching devices 173 and 180 with appropriate gating signals 172 and 176 to provide output regulation in accordance with the teachings of the present invention.

In the example depicted in FIG. 1C, stacked switching circuit with normally-on devices 170 is a half-bridge stacked switching circuit with normally-on devices that includes a normally-off switching device structure 180 coupled in series with a normally-on switch 173 between the primary high-voltage rail 111 and the primary ground rail 101. As depicted in the illustrated example, normally-off switching device structure 180 is a single packaged cascoded semiconductor switching device that includes a normally-on switch 179 cascoded with normally-off switch 177. It is appreciated that in other examples, switches 179 and 177 could be applied in separate packages. In one example, normally-on switch 173 and normally-on switch 179 are high voltage normally-on SiC or GaN switches, and normally-off switch 177 is low voltage normally-off N-channel MOSFET. As shown, the node between normally-on switch 173 and normally-off switching device structure 180 is high potential terminal A 134, which is coupled to the LC tank circuit of stage 150 as mentioned above. Thus, normally-on switch 173 is coupled between the LC tank circuit of stage 150 and one of the rails of input port 120 and normally-off switching device structure 180 is coupled between the LC tank circuit of stage 150 and the other one of the rails of input 120 in accordance with the teachings of the present invention.

In one example, a first controller 171 is coupled to generate a gate signal 172, which is coupled to be received by a gate terminal of normally-on switch 173. Controller 171 is also coupled to the source terminal of normally-on switch 133 and primary ground rail 101 as shown. In one example, a second controller 175 is coupled to generate a gate signal 176, which is coupled to be received by a gate terminal of normally-off switch 177 of normally-off switching device structure 180. Controller 135 is also coupled to controller 171, the source terminal of normally-off switch 177, and high potential terminal A 134 as shown.

As shown in the example, the gate terminal 178 of the normally-on switch 179 is tied to the source terminal of normally-off switch 177, which causes normally-on switch 179 to be turned off when the drain-source voltage across normally-off switch 177 results in a negative gate-source voltage $V_{GS}$ for switch 179 that pinches off the channel of normally-on switch 179. As a result, in one example, the combination of high voltage normally-on switch 179 and low voltage normally-off MOSFET switch 177 forms a normally-off switching device structure 180 that blocks current flow until gate signal 176 from controller 175 actively drives the gate of normally-off switch 177 to turn on normally-off switch 177. As noted with reference to FIG. 1A, it is appreciated that the gate of normally on switch 179 could also be coupled to controller 175 while still benefiting form the teachings of the present invention.

Therefore, when power supply 190 is initially powered up, the combination of normally-on switch 179 and normally-off switch 177 in normally-off switching device structure 180 block any current flow between primary high-voltage rail 111 and primary ground rail 101 in accordance with the teachings of the present invention. It is noted that normally-on switch 173 is on when power supply 190 is first powered up because controller 171 is not powered and therefore cannot generate gate signal 172 to turn off normally-on switch 173. However, since normally-off switching device structure 180 is off at power up and since the LC tank circuit of stage 150 includes series capacitor 152, there is no current flow between primary high-voltage rail 111 and primary ground rail 101, and converter 190 is therefore safe at power up in accordance with the teachings of the present invention, even if normally-on switch 173 is on when power supply 190 is first powered up. It is also appreciated that safety is therefore provided with stacked switching circuit with normally-on devices 170 without having to include a normally-off switch cascoded with normally-on switch 133, which therefore reduces costs and increases efficiency of stacked switching circuit with normally-on devices 170 in accordance with the teachings of the present invention.

Figure 2:
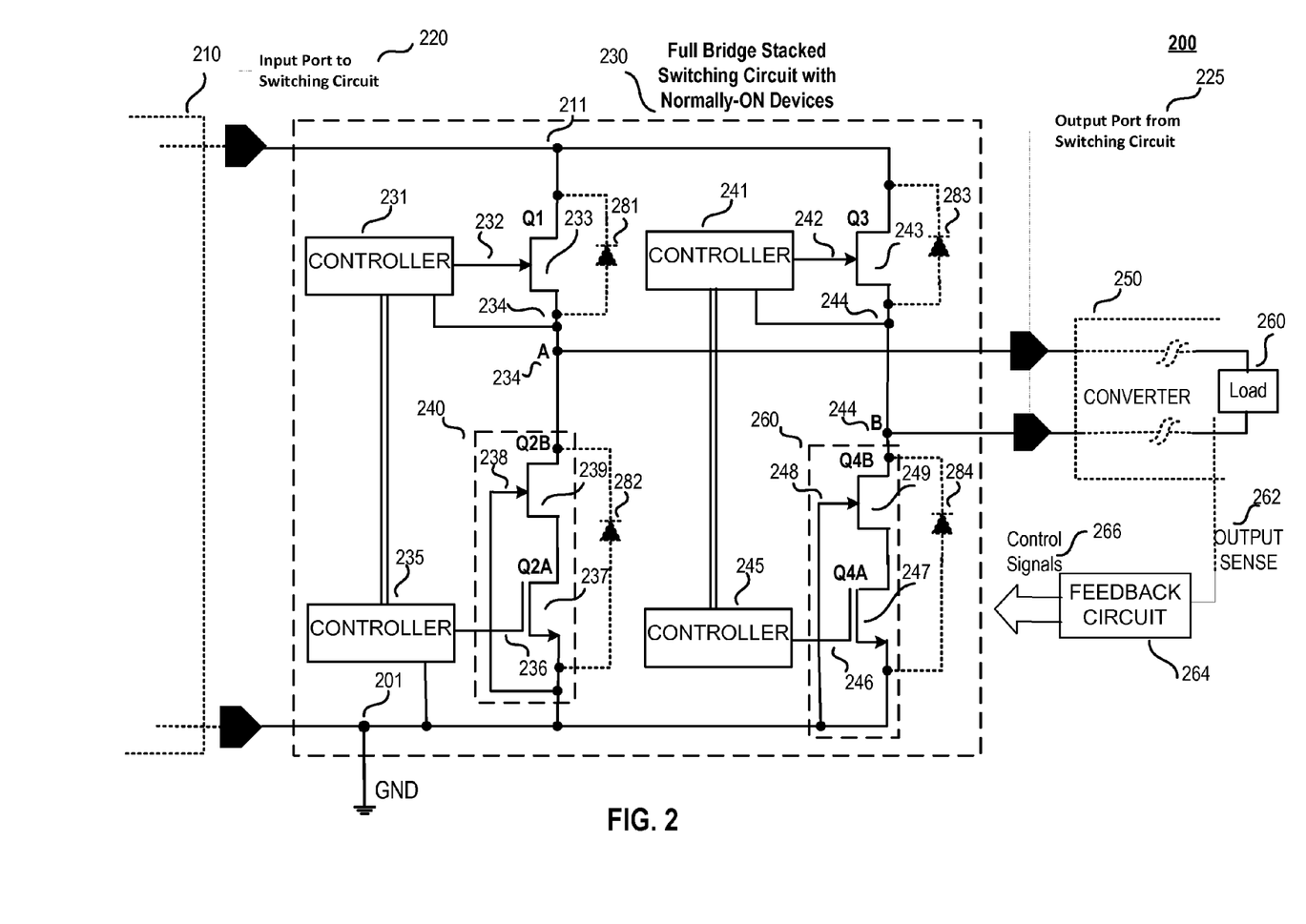
FIG. 2 is an example schematic illustrating generally one example of a full-bridge triplet switching circuit utilized in an example power supply in accordance with the teachings of the present invention.

FIG. 2 is an example schematic illustrating generally another example of a stacked switching circuit with normally-on devices 230 utilized in an example power supply 200 in accordance with the teachings of the present invention. As shown in the depicted example, power supply 200 includes a full bridge utilization of the stacked switching circuit with normally-on devices 230 and includes a front end stage 210 coupled to an input port 220 of the stacked switching circuit with normally-on devices 230. As shown in the depicted example, input port 220 of stacked switching circuit with normally-on devices 230 has two rails that are coupled to receive dc or rectified ac from the two rails of the output port of front-end stage 210. As shown in the example of FIG. 1, the two rails of the input port 120 include a primary high-voltage rail 111 and a primary ground rail 101, which in the example is coupled to ground. In one example, stacked switching circuit with normally-on devices 230 includes an output port 225 that is coupled to provide chopped pulses to an input port of stage 250. In one example, stage 250 includes a switch mode converter to generate a regulated output for load 360, which is coupled to an output of stage 250. It is appreciated that stage 250 may be implemented using any one of a wide variety of switch mode power converter topologies that include various blocks such as for example a rectifier, a filter, isolation, level change regulation and protection, which are not shown in FIG. 2 so as not to obscure the teachings of the present invention.

As shown in the example depicted in FIG. 2, example full-bridge stacked switching circuit with normally-on devices 230 includes of two legs of half-bridge switches, each of which shares many similarities with half-bridge stacked switching circuit with normally-on devices 130 of FIG. 1A. For instance, the first leg of stacked switching circuit with normally-on devices 230 includes a normally-on switch 233 coupled in series with a normally-off switching device structure 240 between the primary high-voltage rail 211 and the primary ground rail 201. As depicted in the illustrated example, normally-off switching device structure 240 is a single packaged cascoded compact semiconductor switching device that includes a normally-on switch 239 cascoded with normally-off switch 237. In one example, normally-on switch 233 and normally-on switch 239 are high voltage normally-on switches, and normally-off switch 237 is low voltage normally-off N-channel MOSFET. As shown, in full-bridge configuration both the terminal node A 234 (between normally-on switch 233 and normally-off switching device structure 240), as well as node B 244 (between normally-on switch 243 and normally-off switching device structure 260) are alternatively coupled to high-voltage rail 211, and are coupled to the input port of stage 250.

In one example, for the left side leg of half-bridge switches, a first controller 231 is coupled to generate a gate signal 232, which is coupled to be received by a gate terminal of normally-on switch 233. Controller 231 is also coupled to the source terminal of normally-on switch 233 and high potential terminal A 234 as shown. In one example, a second controller 235 is coupled to generate a gate signal 236, which is coupled to be received by a gate terminal of normally-off switch 237 of normally-off switching device structure 240. Controller 235 is also coupled to controller 231, the source terminal of normally-off switch 237, and primary ground rail 201 as shown.

As shown in the example, the gate terminal 238 of the normally-on switch 239 is tied to the source terminal of normally-off switch 237, which causes normally-on switch 239 to be turned off when the drain-source voltage across normally-off switch 237 results in a negative gate-source voltage $V_{GS}$ for switch 239 that pinches off the channel of normally-on switch 239. As a result, in one example, the combination of high voltage normally-on switch 239 and low voltage normally-off MOSFET switch 237 forms a normally-off switching device structure 240 that blocks current flow until gate signal 236 from controller 235 actively drives the gate of normally-off switch 237 to turn on normally-off switch 237. Thus, normally-off switching device structure 240 prevents a short from the first input port of stage 250 to primary ground rail 201 through normally-off switching device structure 240 until gate signal 246 actively turns on normally-off switching device structure 240.

Continuing with the example depicted in FIG. 2, the second leg of stacked switching circuit with normally-on devices 230 includes a normally-on switch 243 coupled in series with a normally-off switching device structure 260 between the primary high-voltage rail 211 and the primary ground rail 201. As depicted in the illustrated example, normally-off switching device structure 260 is a single packaged cascoded compact semiconductor switching device that includes a normally-on switch 249 cascoded with normally-off switch 247. In one example, normally-on switch 243 and normally-on switch 249 are high voltage normally-on switches, and normally-off switch 247 is low voltage normally-off N-channel MOSFET. As shown, the node between normally-on switch 243 and normally-off switching device structure 260 is high potential terminal B 244, which is coupled to the second input port of stage 250.

In one example, a third controller 241 is coupled to generate a gate signal 242, which is coupled to be received by a gate terminal of normally-on switch 243. Controller 241 is also coupled to the source terminal of normally-on switch 243 and high potential terminal B 244 as shown. In one example, a fourth controller 235 is coupled to generate a gate signal 236, which is coupled to be received by a gate terminal of normally-off switch 237 of normally-off switching device structure 240. Controller 235 is also coupled to controller 231, the source terminal of normally-off switch 237, and primary ground rail 201 as shown.

As shown in the example, the gate terminal 248 of the normally-on switch 249 is tied to the source terminal of normally-off switch 247, which causes normally-on switch 249 to be turned off when the drain-source voltage across normally-off switch 247 results in a negative gate-source voltage $V_{GS}$ for switch 249 that pinches off the channel of normally-on switch 139. As a result, in one example, the combination of high voltage normally-on switch 249 and low voltage normally-off MOSFET switch 247 forms a normally-off switching device structure 260 that blocks current flow until gate signal 266 from controller 245 actively drives the gate of normally-off switch 247 to turn on normally-off switch 247. Thus, normally-off switching device structure 260 prevents a short from the second input port of stage 250 to primary ground rail 201 through normally-off switching device structure 260 until gate signal 266 actively turns on normally-off switching device structure 260.

In the illustrated example at startup, before controller 231 is powered to turn normally-on switch 233 off, the voltage from the primary high-voltage rail 211 is applied to high potential terminal A 234 to the output port 225. In addition, due to controller 241 also being unpowered at startup, normally-on switch 243 is also not yet turned off and the same voltage from primary high-voltage rail 211 is applied to high potential terminal B 244 at startup. As a result, before the controllers of full-bridge stacked switching circuit with normally-on devices 230 are powered up, the output port 225 from full-bridge stacked switching circuit with normally-on devices 230 to the input port of stage 250 is shorted through normally-on switch 233 and normally-on switch 243. Accordingly, appropriate precautions should be taken to avoid any reverse discharge.

In one example after startup, normal switching is established. In the first switching half cycle, normally-on switch 233 remains on while controller 231 does not apply a negative gate signal 232 to turn-off the normally-on switch 233, controller 235 turns off the normally-off switching device structure 240 by removing the positive signal from gate to source of switch 237, controller 241 turns off the normally-on switch 243 by applying a negative signal from gate to source of switch 233 and controller 245 turns on normally-off switching device structure 260 by applying a positive signal from gate to source of switch 247, which results in $V_A > V_B$ and substantially applies a positive pulse $V_{AB} > 0$ at output port 225 from full-bridge stacked switching circuit with normally-on devices 230 to the input port of stage 250. In the next switching half cycle, controller 231 turns off normally-on switch 233, controller 235 turns on normally-off switching device structure 240 by applying a positive signal from gate to source of switch 237, controller 241 turns on normally-on switch 243 by removing the negative signal from gate to source of switch 243 and controller 245 turns off normally-off switching device structure 260 by removing the positive signal from gate to source of switch 247, which results in $V_A < V_B$ and substantially applies a negative pulse $V_{AB} < 0$ at output port 225 from full-bridge stacked switching circuit with normally-on devices 230 to the input port of stage 250. Thus, in full switching cycle, full-bridge stacked switching circuit with normally-on devices 230 provides an alternating pulse to the stage 250 of the power supply 200 in accordance with the teachings of the present invention. As can be appreciated to a person having ordinary skill in the art, as a consequence of turn on and turn off delays in switching devices, a marginal dead-gap between the turn-off of the first series switching device and the turn-on of the second series switching device in each leg is helpful to help prevent any on-time overlap and shoot through of input lines.

Figure 3:
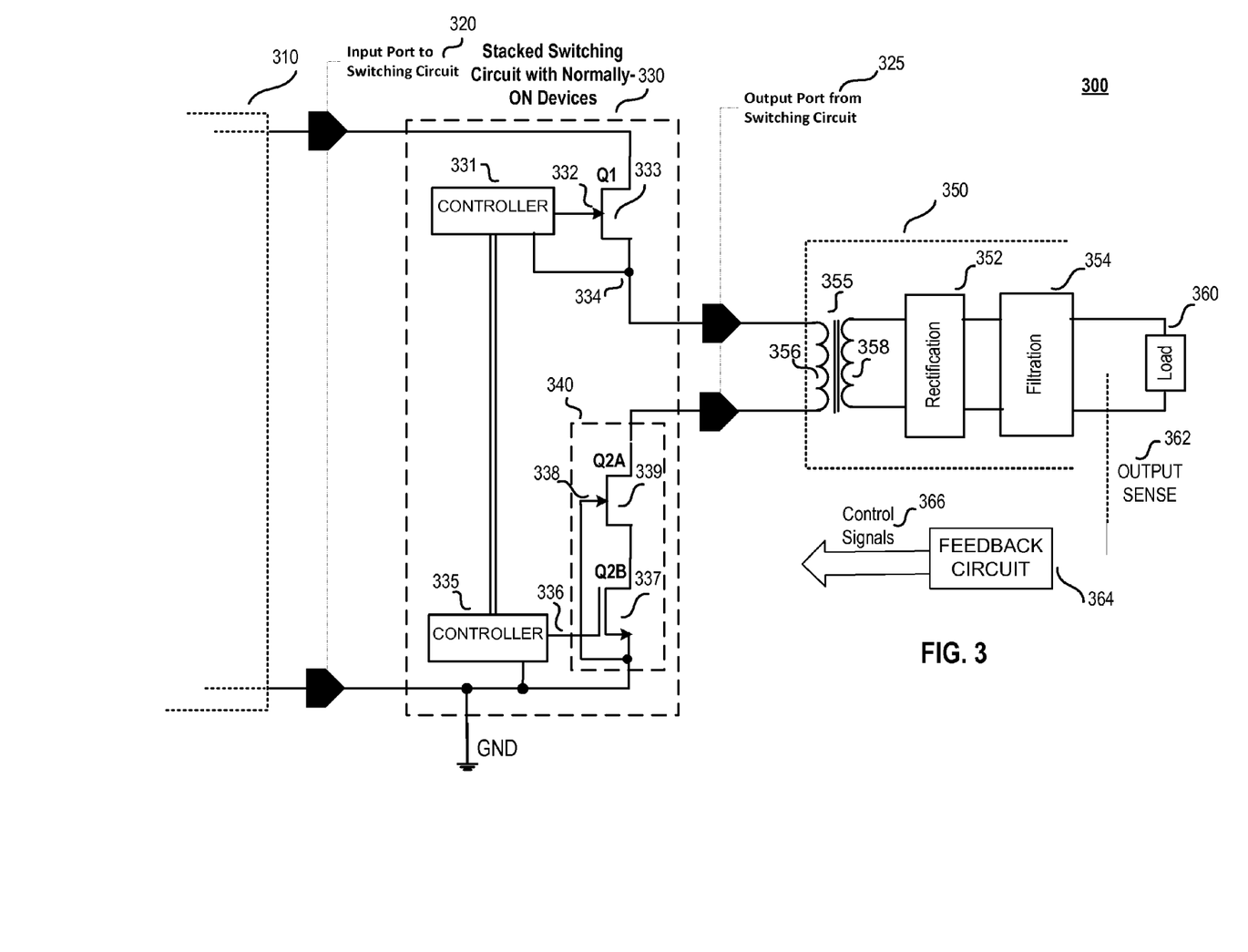
FIG. 3 is an example schematic illustrating generally one example of a triplet switching circuit utilized in an example double switch forward or flyback configured power supply in accordance with the teachings of the present invention.

FIG. 3 is an example schematic illustrating generally one example of a stacked switching circuit with normally-on devices 330 utilized in an example double switch configured power supply 300 in accordance with the teachings of the present invention. In one example, power supply 300 is forward converter. In another example, power supply 300 is a flyback converter. As shown in the example of FIG. 3, a front end stage 310 is coupled to an input port 320 of stacked switching circuit with normally-on devices 330. As shown in the depicted example, the input port 320 of stacked switching circuit with normally-on devices 330 has two rails that are coupled to receive dc or rectified ac from the two rails of the output port of front-end stage 310. As shown in the example of FIG. 3, the two rails of the input port 320 include a primary high-voltage rail 311 and a primary ground rail 301, which in the example is coupled to ground. In one example, stacked switching circuit with normally-on devices 330 also includes an output port 325 that is coupled to provide chopped pulses to an input port of stage 350.

In the example depicted in FIG. 3, stacked switching circuit with normally-on devices 330 includes a normally-on switch 333 coupled to primary high voltage rail 311. Triplet 330 also includes a normally-off switching device structure 340 coupled to the primary ground rail 101. In one example, normally-off switching device structure 340 is a single packaged cascoded compact semiconductor switching device that includes a normally-on switch 339 cascoded with normally-off switch 337. In one example, normally-on switch 333 and normally-on switch 339 are high voltage normally-on switches, and normally-off switch 337 is low voltage normally-off N-channel MOSFET. In one example, a first controller 331 is coupled to generate a gate signal 332, which is coupled to be received by a gate terminal of normally-on switch 333. Controller 331 is also coupled to the source terminal of normally-on switch 333 and whenever the gate terminal of normally-on switch 333 goes sufficiently negative relative to the source terminal, the normally-on switch 333 is pinched off. In one example, a second controller 335 is coupled to generate a gate signal 336, which is coupled to be received by a gate terminal of normally-off switch 337 of normally-off switching device structure 340. Controller 335 is also coupled to controller 331, the source terminal of normally-off switch 337, and primary ground rail 301 as shown. Whenever the gate terminal of normally-off switch 337 goes sufficiently positive relative to the source terminal, the normally-off switch 337 is turned on.

As shown in the example, the gate terminal 338 of the normally-on switch 339 is tied to the source terminal of normally-off switch 337, which causes normally-on switch 339 to be turned off when the drain-source voltage across normally-off switch 337 results in a negative gate-source voltage $V_{GS}$ for switch 339 that pinches off the channel of normally-on switch 339. As a result, in one example, the combination of high voltage normally-on switch 339 and low voltage normally-off MOSFET switch 337 forms a normally-off switching device structure 340 that blocks current flow until gate signal 336 from controller 335 actively drives the gate of normally-off switch 337 to turn on normally-off switch 337. It is again appreciated that in other configurations in accordance with the teachings of the present invention, the gate terminal 338 of normally-on switch 339 could be coupled to controller block 335.

As shown in the example depicted in FIG. 3, the input port of stage 350 includes a primary winding 356 of an energy transfer element 355. As shown, one end of primary winding 356 is coupled to a source terminal 334 of normally-on switch 333 and the other end of primary winding 356 is coupled to a drain terminal of normally-on switch 339 of normally-off switching device structure 340. In the illustrated example, the energy transfer element 355 also includes a secondary winding 359 that is coupled to a rectification stage 352, which is coupled to a filtration stage 354, which is coupled to a load 360. In one example, the output quantity supplied to load 360 is sensed with output sense 362 through feedback circuit 364. Process circuitry generates control signals 366, which are coupled to be received by controller 331 and controller 335 to control switching of switching devices 333 and 340 with appropriate gating signals 332 and 336 to provide output regulation in accordance with the teachings of the present invention.

In one example, normally-on switch 333 and normally-off switching device structure 340 are controlled by controller 331 and controller 335, respectively, as a single switching device and switch simultaneously on and off chopping the HV bus voltage between primary high-voltage rail 311 and a primary ground rail 301 to apply the pulses at output port 325 to the input port of stage 350 of the double switch configured power supply 300. Thus, in one example, for a simultaneous switching of normally-on switch 333 and normally-off switching device structure 340, when a positive gating signal 336 is applied to turn on normally-off switching device structure 340, the normally-on switch 333 should not receive a negative gate signal 332 from controller 331 to avoid any pinch off of the current, which would turn off normally-on switch 333.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. A stacked switching circuit with normally-on devices including at least a triplet of switches for use with a power converter comprising:
   a first normally-on switch having a first terminal coupled to a first input rail at an input port of the switching circuit with normally-on devices, wherein a second terminal of the first normally-on switch is directly coupled to an output port of the switching circuit with normally-on devices, and wherein a control terminal of the first normally-on switch is directly coupled to receive a first control signal directly from a first controller to switch off the first normally-on switch; and
   a normally-off switching device structure coupled to the first normally-on switch, wherein the normally-off switching device structure includes:
      a second normally-on switch having a first terminal coupled to the output port of the switching circuit with normally-on devices; and
      a normally-off switch coupled to the second normally-on switch in a cascode coupled configuration such that a second terminal of the second normally-on switch is coupled to a first terminal of the normally-off switch, wherein a second terminal of the normally-off switch is coupled to a second input rail of the switching circuit with normally-on devices at the input port of the stacked switching circuit with normally-on devices, wherein the normally-off switch is coupled to be switched on in response to a second control signal received at the control terminal of the normally-off switch, wherein the first and second control signals are coupled to control switching of the switching circuit with normally-on devices to provide chopped high frequency pulses through the output port of the switching circuit with normally-on devices, and wherein the normally-off switch coupled to the second normally-on switch in the cascode coupled configuration block current flow through the switching circuit with normally-on devices between the first input rail and the second input rail at startup of the switching circuit with normally-on devices.

2. The stacked switching circuit with normally-on devices of claim 1 further comprising:
   the first controller coupled to generate the first control signal in response to a feedback signal representative of an output of the power converter; and
   a second controller coupled to generate the second control signal in response to the feedback signal representative of the output of the power converter.

3. The stacked switching circuit with normally-on devices of claim 1 wherein the first and second normally-on switches comprise high voltage SiC switches.

4. The stacked switching circuit with normally-on devices of claim 1 wherein the first and second normally-on switches comprise GaN switches.

5. The stacked switching circuit with normally-on devices of claim 1 wherein the normally-off switch comprises a stacked switching circuit with normally-on devices N-channel MOSFET switch.

6. The stacked switching circuit with normally-on devices of claim 1 wherein the normally-off switching device structure is included in a single packaged cascoded compact semiconductor integrated circuit switching device.

7. The stacked switching circuit with normally-on devices of claim 1 wherein the first normally-on switch forms an upper switching unit of a half-bridge converter configuration and the normally-off switching device structure including the second normally-on switch coupled to the normally-off switch in the cascode coupled configuration forms a lower switching unit of the half-bridge configuration.

8. The stacked switching circuit with normally-on devices of claim 1 wherein the stacked switching circuit with normally-on devices is one of two legs of half-bridge switches included in a full-bridge switching circuit.

9. The switching circuit with normally-on devices of claim 1 wherein the power converter includes an LC tank circuit coupled to the output port of the switching circuit with normally-on devices.

10. The switching circuit with normally-on devices of claim 1 wherein the first normally-on switch and the normally-off switch are switched simultaneously on and off to provide chopped high frequency pulses to be coupled to an energy transfer element of a double switch configured power supply coupled to the output port of the switching circuit with normally-on devices.

11. The stacked switching circuit with normally-on devices of claim 1 wherein a control terminal of the second normally-on switch is coupled to the second terminal of the normally-off switch.

12. A stacked switching circuit with normally-on devices for use with a power converter, comprising:
   a normally-off switching device structure, including:
      a first normally-on switch having a first terminal coupled to a first input rail of the stacked switching circuit with normally-on devices; and
      a normally-off switch coupled to the first normally-on switch in a cascode coupled configuration such that a second terminal of the first normally-on switch is coupled to a first terminal of the normally-off switch, wherein a second terminal of the normally-off switch is coupled to an output port of the stacked switching circuit with normally-on devices, and wherein the normally-off switch is coupled to be switched in response to a first control signal received at a control terminal of the normally-off switch; and
   a second normally-on switch coupled to the normally-off switching device structure, the second normally-on switch having a first terminal coupled to the output port of the stacked switching circuit with normally-on devices, wherein a second terminal of the second normally-on switch is directly coupled to a second input rail of the stacked switching circuit with normally-on devices, and wherein a control terminal of the second normally-on switch is directly coupled to receive a second control signal directly from a second controller to switch the second normally-on switch, wherein the first and second control signals are coupled to control switching of the stacked switching circuit with normally-on devices to provide chopped high frequency pulses through the output port of the stacked switching circuit with normally-on devices, and wherein the normally-off switch coupled to the first normally-on switch in the cascode coupled configuration block current flow through the stacked switching circuit with normally-on devices between the first input rail and the second input rail at startup of the stacked switching circuit with normally-on devices.

13. The stacked switching circuit with normally-on devices of claim 12 further comprising:
   a first controller coupled to generate the first control signal in response to a feedback signal representative of an output of the power converter; and
   the second controller coupled to generate the second control signal in response to the feedback signal representative of the output of the power converter.

14. The stacked switching circuit with normally-on devices of claim 12 wherein the first and second normally-on switches comprise high voltage SiC switches.

15. The stacked switching circuit with normally-on devices of claim 12 wherein the first and second normally-on switches comprise GaN switches.

16. The stacked switching circuit with normally-on devices of claim 12 wherein the normally-off switch comprises a N-channel MOSFET switch.

17. The stacked switching circuit with normally-on devices of claim 12 wherein the normally-off switching device structure included in a single packaged cascoded compact semiconductor integrated circuit switching device.

18. The stacked switching circuit with normally-on devices of claim 12 wherein the normally-off switching device structure including the normally-off switch coupled to the first normally-on switch in the cascode coupled configuration forms an upper switching unit of a half-bridge configuration and the second normally-on switch forms a lower switching unit of the half-bridge converter configuration.

19. The stacked switching circuit with normally-on devices of claim 12 wherein the power converter includes an LC tank circuit coupled to the output port of the stacked switching circuit with normally-on devices.

20. The stacked switching circuit with normally-on devices of claim 12 wherein a control terminal of the first normally-on switch is coupled to the second terminal of the normally-off switch.

* * * * *